United States Patent
Barraud et al.

(10) Patent No.: US 11,398,593 B2
(45) Date of Patent: Jul. 26, 2022

(54) METHOD FOR PRODUCING AN ELECTRONIC COMPONENT WITH DOUBLE QUANTUM DOTS

(71) Applicant: COMMISSARIAT A L'ENERGIE ATOMIQUE ET AUX ENERG, Paris (FR)

(72) Inventors: Sylvain Barraud, Le Grand Lemps (FR); Louis Hutin, Saint Martin le Vinoux (FR); Maud Vinet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/758,259

(22) PCT Filed: Oct. 17, 2018

(86) PCT No.: PCT/FR2018/052592
§ 371 (c)(1),
(2) Date: Apr. 22, 2020

(87) PCT Pub. No.: WO2019/081837
PCT Pub. Date: May 2, 2019

(65) Prior Publication Data
US 2020/0343435 A1    Oct. 29, 2020

(30) Foreign Application Priority Data
Oct. 26, 2017  (FR) ........................ 1760103

(51) Int. Cl.
*H01L 39/24* (2006.01)
*G06N 10/00* (2022.01)
(Continued)

(52) U.S. Cl.
CPC ......... *H01L 39/2493* (2013.01); *G06N 10/00* (2019.01); *H01L 29/0673* (2013.01);
(Continued)

(58) Field of Classification Search
CPC . H01L 39/2493; H01L 39/025; H01L 39/223; H01L 39/228; G06N 10/00; B82Y 10/00; B82Y 40/00
See application file for complete search history.

(56) References Cited

U.S. PATENT DOCUMENTS

2007/0210338 A1   9/2007  Orlowski
2013/0037877 A1*  2/2013  Tan ................... H01L 29/42328
                                                                    257/316
(Continued)

FOREIGN PATENT DOCUMENTS

WO   WO 2007/127523 A2   11/2007
WO   WO 2008/044828 A1   4/2008

OTHER PUBLICATIONS

International Search Report dated Feb. 19, 2019 in PCT/FR2018/052592, 3 pages.
(Continued)

*Primary Examiner* — Matthew L Reames
(74) *Attorney, Agent, or Firm* — Oblon, McClelland, Maier & Neustadt, L.L.P.

(57) ABSTRACT

A process for fabricating an electronic component incorporating double quantum dots and split gates includes providing a substrate surmounted with a stack of a semiconductor layer and of a dielectric layer that is formed above the semiconductor layer. The process also includes forming a mask on the dielectric layer and etching the dielectric layer and the semiconductor layer with the pattern of the mask, so as to form a stack of a semiconductor nanowire and of a dielectric hard mask. Finally, the process includes depositing
(Continued)

a gate material on all of the wafer and carrying out a planarization, until the dielectric hard mask is reached, so as to form first and second gates that are electrically insulated from each other on either side of said nanowire.

10 Claims, 8 Drawing Sheets

(51) Int. Cl.
    *H01L 39/02*     (2006.01)
    *H01L 39/22*     (2006.01)
    *H01L 29/423*     (2006.01)
    *H01L 29/66*     (2006.01)
    *H01L 29/06*     (2006.01)
    *B82Y 10/00*     (2011.01)
    *B82Y 40/00*     (2011.01)

(52) U.S. Cl.
    CPC .. *H01L 29/42312* (2013.01); *H01L 29/66439* (2013.01); *H01L 29/66977* (2013.01); *H01L 29/66984* (2013.01); *H01L 39/025* (2013.01); *H01L 39/223* (2013.01); *H01L 39/228* (2013.01); *B82Y 10/00* (2013.01); *B82Y 40/00* (2013.01)

(56) References Cited

U.S. PATENT DOCUMENTS

| | | |
|---|---|---|
| 2015/0279981 A1 | 10/2015 | Eriksson et al. |
| 2016/0300155 A1 | 10/2016 | Betz et al. |

OTHER PUBLICATIONS

L. Hutin et al., "SOI CMOS Technology for Quantum Information Processing", 2017 IEEE International Conference on IC Design And Technology (ICICDT), IEEE, XP33131249, May 23, 2017, pp. 1-4.

* cited by examiner

METHOD FOR PRODUCING AN ELECTRONIC COMPONENT WITH DOUBLE QUANTUM DOTS

FIELD OF THE INVENTION

The invention relates to electronic components incorporating quantum dots, and more particularly to processes for fabricating electronic components incorporating quantum dots.

DISCUSSION OF THE BACKGROUND

Quantum electronics provides a way of improving performance. By analogy with conventional electronics, the quantum bit is the basic element of computation in quantum electronics. In conventional electronics, Boolean computations are carried out using bits having one among two possible states. A quantum bit is a superposition of the eigenstates |0> and |1>.

Quantum dots are the basic components of quantum electronics. Quantum dots use semiconductor nanostructures to form potential wells for confining electrons or holes in the three dimensions of space. Quantum information is then coded into purely quantum degrees of freedom: currently the ½ spin of the electron. Quantum dots are used to trap an isolated electron to store one cubit. With respect to a system using binary logic, quantum dots then make it possible to benefit from greatly increased computational powers.

The document entitled 'Dispersively detected Pauli Spin Blockade in a silicon nanowire FET', published by Betz et al. May 4, 2015, describes a quantum electronic component. The fabrication of the electronic component comprises providing a substrate surmounted with a semiconductor layer. The semiconductor layer is etched to define the pattern of a nanowire. First and second dielectric layers are then deposited on all of the wafer.

The fabrication then comprises a step of defining a photolithography mask with alignment of gate patterns on the semiconductor nanowire, so that the photolithography mask is set back with respect to opposite edges of the semiconductor nanowire. The fabrication then comprises a step of etching the dielectric layers with the gate patterns, to uncover the opposite top edges of the nanowire, and the lateral faces of the nanowire in the extension of these edges. A gate insulator and a gate material are then deposited on the uncovered portions of the nanowire, corresponding to the etch patterns.

Such a process has drawbacks. On the one hand, the alignment of the gates with respect to the axis of the semiconductor nanowire is tricky to achieve when the dimensions of the nanowire are small. On the other hand, the substrate area taken up by the device is large, the minimum distance between the gates being defined by the smallest available photolithography-pattern width. To allow the gates to extend over the edges of the nanowire, the width of the nanowire must also be larger than this smallest photolithography-pattern width, this adversely affecting still further integration density. A relatively wide nanowire also adversely affects coupling between quantum dots.

Document US2016300155 succinctly describes a structure of a Qbit device. This document describes forming two electrodes on a gate-insulator layer covering a nanowire. A fabrication process is briefly described and includes forming nanowires on an SOI substrate. A gate stack is then formed by depositing an HfSiON layer, which is covered with a TiN and a polysilicon layer. This document mentions separating two gates with an etch.

The document 'SOI Technology for Quantum Information Processing', written by L. Hutin et al. and published in the context of the 2016 IEEE International Electron Devices Meeting (IEDM), describes a structure incorporating double quantum dots and split gates. A fabricating process in which a nanowire is formed, an insulator is formed on the nanowire by thermal oxidation, and then a stack consisting of a gate insulator and a gate metal is deposited, is described very succinctly.

SUMMARY OF THE INVENTION

The invention aims to solve one or more of these drawbacks. The invention thus relates to a process for fabricating an electronic component incorporating double quantum dots and split gates, such as defined in the appended claims.

The invention also relates to the variants of the dependent claims. Those skilled in the art will understand that each of the features of the dependent claims may be combined independently with the features of an independent claim, without however constituting an intermediate generalization.

BRIEF DESCRIPTION OF THE DRAWINGS

Other features and advantages of the invention will become more clearly apparent from the description that is given thereof below, by way of completely nonlimiting indication, with reference to the appended drawings, in which.

DETAILED DESCRIPTION OF THE EMBODIMENTS OF THE INVENTION

The invention provides a process for fabricating an electronic component incorporating double quantum dots and split gates. The invention proposes to provide a stack of a semiconductor layer and of a dielectric layer that is formed above the semiconductor layer. After formation of a mask on the stack, the dielectric layer and the semiconductor layer are etched with the pattern of the mask to obtain a stack of a semiconductor nanowire and of a dielectric nanowire. A gate material is then deposited on all of the wafer. A chemical planarization is then carried out until the dielectric nanowire is reached, so as to form first and second gates that are electrically insulated from each other by this dielectric nanowire.

Figure 1:
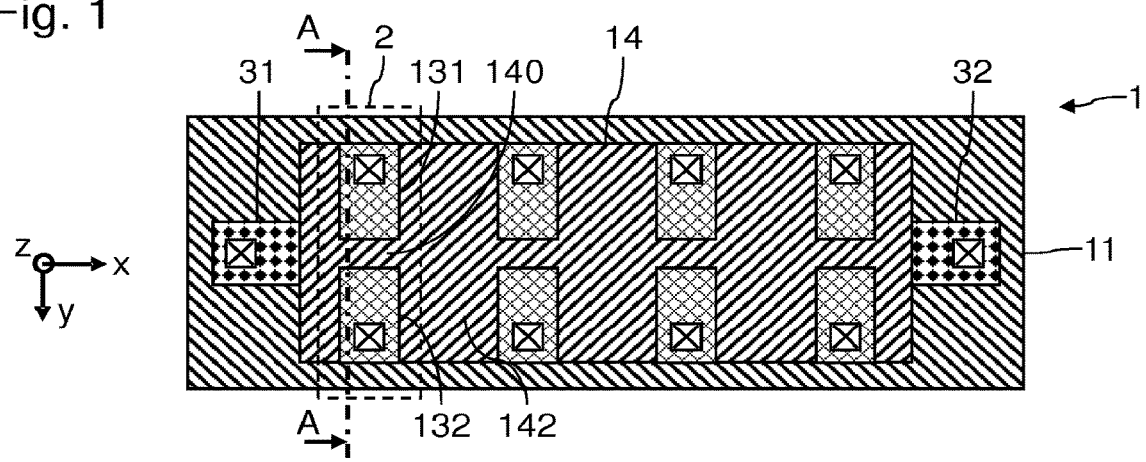
FIG. 1 is a top view of an example of an electronic component incorporating double quantum dots according to a first embodiment of the invention.

FIG. 1 is a top view of an example of an electronic circuit 1 produced using a fabrication process according to the invention. For the sake of legibility, a system of axes is illustrated here, the axis X defining the longitudinal direction below, the axis Y defining the transverse direction below and the axis Z defining the vertical direction below. The illustrated electronic circuit 1 is given merely by way of example because it includes at least one component 2 incorporating double quantum dots and split gates. Other electronic-circuit structures may of course be produced with a fabrication process according to the invention. The electronic circuit 1 illustrated thus includes a plurality of components 2 connected in series. The electronic components 2 are thus connected in series between a first access 31 and a second access 32.

Figures 2, 3:
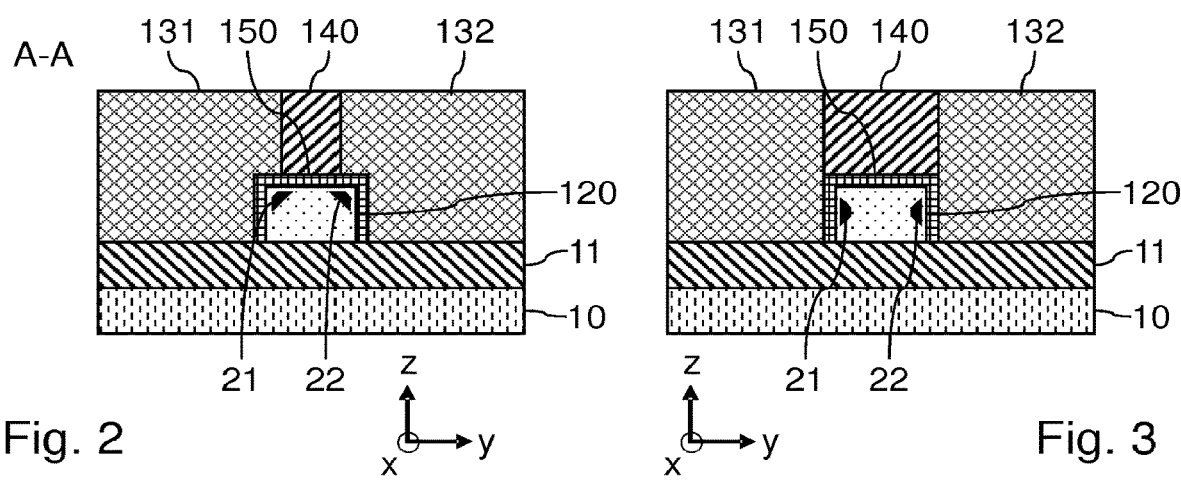
FIG. 2 is a transverse cross-sectional view of a double quantum dot according to the first embodiment of the invention.
FIG. 3 is a transverse cross-sectional view of a double quantum dot according to a second embodiment of the invention.

FIG. 2 is a transverse cross-sectional view of an electronic component 2 of FIG. 1, this component being obtained according to a first embodiment. FIG. 2 further illustrates the structure of the electronic component 2 and of the electronic circuit 1.

The electronic component 2 is here formed on a silicon-on-insulator substrate. The substrate thus comprises as known per se a silicon layer 10 covered with a buried insulating layer 11 (which lies in a plane including the directions X and Y). A semiconductor nanowire 120 (here made of silicon or of silicon alloy) is formed on the buried insulating layer 11 and extends in the direction X. The silicon nanowire 120 is here illustrated in cross section through its middle portion, which is a region in which quantum dots will be formed. This middle portion of the nanowire 120 is covered with a gate-insulator layer 150, on its top face and on its lateral faces. In this middle portion, a first quantum dot 21 is formed in proximity to a ridge between the top face and one lateral face of the nanowire 120, a second quantum dot 22 being formed in proximity to a ridge between the top face and the other lateral face of the nanowire 120. The quantum dots are configured to trap a single particle (an electron or a hole as appropriate) in order to allow the state of its spin to be modified or read. A hard mask made of dielectric 140 is placed plumb with the semiconductor nanowire 120, on the gate-insulator layer 150. In the middle portion of the nanowire 120, control gates 131 and 132 are produced on either side of the stack of the nanowire 120 and of the hard mask 140. The control gates 131 and 132 are thus electrically insulated from each other, by way of the gate-insulator layer 150 and of the separating hard mask 140.

In the present embodiment, the stack of the nanowire 120 and of the hard mask 140 is symmetric with respect to a plane including the directions X and Z. In the present embodiment, the hard mask 140 is narrower than the stack of the nanowire 120 and of the gate-insulator layer 150. The gates 131 and 132 here extend over the gate insulator 150 and the nanowire 120. Such a configuration makes it easier to position the quantum dots 21 and 22 in proximity to the ridges between the top face and the lateral faces of the gate insulator 150. The quantum dots 21 and 22 may thus be brought closer to each other so as to improve their coupling, and their distance may be smaller than would normally be possible given the minimum photolithography width useable to define the width of the nanowire 120 by etching. Likewise, such a configuration allows a distance between the gates 131 and 132 smaller than the minimum photolithography width to be obtained, using a fabrication process that will be detailed below. Such a configuration allows a nanowire 120 of a minimum width to be used, this allowing interference between the quantum dots to be increased, and thus the potential required to read the quantum dots to be decreased and the read speed of these quantum dots to be increased.

The nanowire 120 extends on either side of the gates 131 and 132 (and of the quantum dots 21 and 22) in the longitudinal direction X. The nanowire 120 thus comprises first and second conduction electrodes formed on either side of the quantum dots 21 and 22. The various electronic components 2 are here connected in series by way of conduction electrodes formed in their semiconductor nanowire 120. A conduction electrode of a first component 2 is connected to the first access 31, a conduction electrode of another component 2 being connected to the second access 32.

The gates of the various components 2 are electrically insulated from one another by partitions 142 made of the same dielectric as the hard mask 140.

FIG. 3 is a transverse cross-sectional view of an electronic component 2 obtained according to a second embodiment. The component 2 of FIG. 3 has substantially the same structure and the same geometry as the component 2 illustrated in FIG. 2. The component 2 obtained according to the second embodiment differs from that of the first embodiment solely in the geometry of the hard mask 140 and of the gates 131 and 132.

In the present embodiment, the stack of the nanowire 120 and of the hard mask 140 is symmetric with respect to a plane including the directions X and Z. In the present embodiment, the hard mask 140 has the same width as the stack of the nanowire 120 and of the gate-insulator layer 150. The lateral faces of the hard mask 140 are here aligned with the lateral faces of the gate-insulator layer 150. The gates 131 and 132 here do not extend over the gate insulator 150 and nanowire 120. Such a configuration makes it easier to position the quantum dots 21 and 22 toward the lateral faces of the gate insulator 150.

Figure 4:
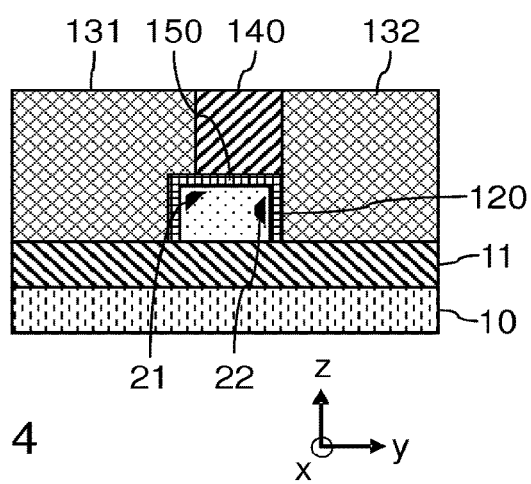
FIG. 4 is a transverse cross-sectional view of a double quantum dot according to a third embodiment of the invention.

FIG. 4 is a transverse cross-sectional view of an electronic component 2 obtained according to a third embodiment. The component 2 of FIG. 4 has substantially the same structure and the same geometry as the component 2 illustrated in FIG. 2. The component 2 obtained according to the third embodiment differs from that of the first embodiment solely in the geometry of the hard mask 140 and of the gates 131 and 132.

In the present embodiment, the stack of the nanowire 120 and of the hard mask 140 is not symmetric with respect to a plane including the directions X and Z. In the present embodiment, the hard mask 140 is narrower than the stack of the nanowire 120 and of the gate-insulator layer 150. The gate 131 here extends over the gate insulator 150 and the nanowire 120. In contrast, a lateral face of the hard mask 140 is here aligned with a lateral face of the gate-insulator layer 150, so that the gate 132 does not extend over the gate insulator 150 and nanowire 120.

Such a configuration allows a different behavior to be obtained for the quantum dots 21 and 22, this possibly proving to be advantageous with respect to the operation of the electronic component 2. The quantum dot 21 may then for example be a read quantum dot, the quantum dot 22 then possibly being a manipulation quantum dot.

In addition, this configuration makes it possible to bring the quantum dot 21 closer to the ridge between the upper face and one lateral face of the gate-insulator layer 150. Moreover, such a configuration makes it possible to obtain a distance between the gates 131 and 132 that is smaller than the minimum photolithography width, using a fabrication process that will be detailed below.

In the various embodiments, the gate-insulator layer 150 is advantageously a single dielectric layer and advantageously a single layer made of a homogenous dielectric. It is also possible to envision the gate-insulator layer 150 being a superposition of a dielectric layer and of an interface layer. Advantageously, the gate-insulator layer 150 includes no nitride, nor a superposition of a nitride layer and of another dielectric layer.

Figure 5:
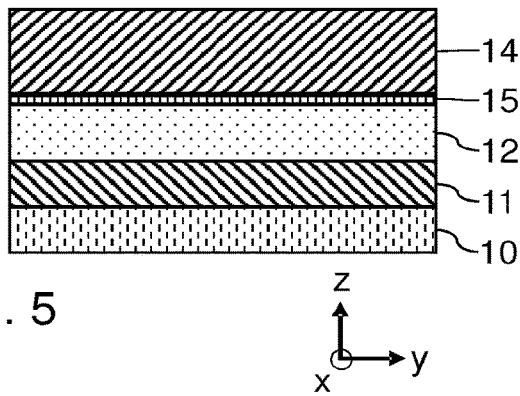
FIGS. 5 to 8 are transverse cross-sectional views of the component of FIG. 1 in various steps of an example of a fabrication process.
Figure 6:
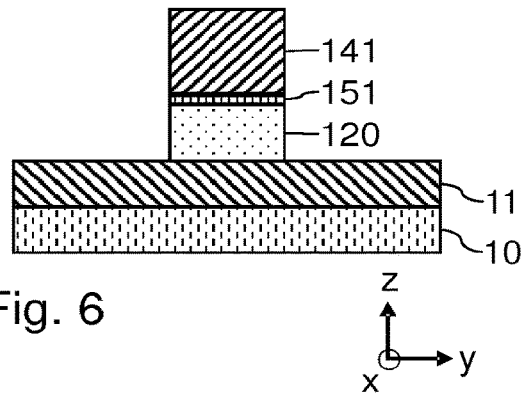
Figure 7:
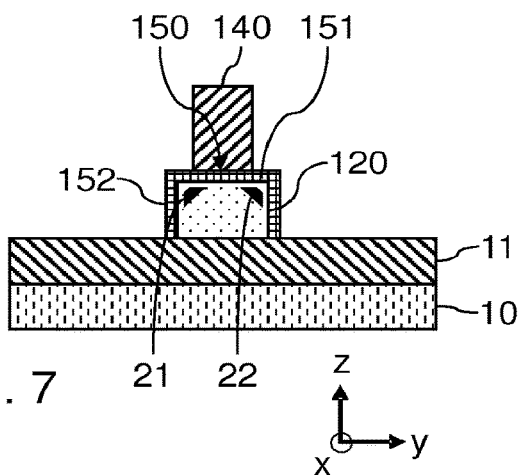

FIGS. 5 to 7 illustrate various steps of an example of a fabrication process according to the first embodiment, via transverse cross sections through a region intended to form the double quantum dots.

In FIG. 5, a stack of a silicon-on-insulator substrate comprising a silicon layer 10, covered with a buried insulating layer, covered with a semiconductor layer 12 (which is for example made of silicon or silicon alloy) has been provided. The layer 12 has been covered with a gate-insulator layer 15. The layer 15 has been covered with a dielectric layer 14.

The layer 11 may for example be made of $SiO_2$. The layer 11 may for example have a thickness comprised between 10 and 145 nanometers. Such a layer 11 is frequently designated by the term UTBOX, this allowing the layer 10 to be biased with a view to electrostatic control of the semiconductor nanowire to be formed.

The layer 12 is for example made of unintentionally doped silicon. The layer 12 may for example have a thickness at least equal to 5 nm, and preferably comprised between 8 and 12 nm.

The gate-insulator layer 15 is for example made of $SiO_2$. The layer 15 may for example have a thickness at least equal to 3 nm, and preferably equal to at least 4 nm. A gate-insulator layer 15 of relatively large thickness promotes the separation of any parasitic charge from the quantum dots to be formed. It is also possible to envision forming the gate-insulator layer 15 from a Hk material, $HfO_2$ for example.

The dielectric layer 14 is for example made of SiN. The dielectric layer 14 may also be made (nonlimitingly) of SiO2. The layer 14 may for example have a thickness at least equal to 40 nm, and preferably at least equal to 50 nm. The thickness of the layer 14 is defined so as to be able to subsequently carry out a step of planarizing (by chemical-mechanical polishing for example) and possibly of siliciding. A mask is then formed, for example by photolithography, on the dielectric layer 14, in a pattern. The gate-insulator layer 15 is advantageously formed by thermal oxidation of the top face of a layer 12 made of silicon, before the deposition of the gate-insulator layer 15, this making it possible to avoid trapping charge at the interface between this gate-insulator layer 15 and the layer 12. Thus, trapping of charge that could affect the operation of the quantum dots to be formed is avoided.

In FIG. 6, the layers 14, 15 and 12 have been etched with the pattern of the mask formed on the layer 14, the etching being stopped on the buried insulating layer 11. The etching may for example be anisotropic, for example etching of the active region with the species $HBr/O_2/Cl_2$. Thus, a semiconductor nanowire 120, surmounted with a top gate-insulator layer 151, surmounted with a dielectric nanowire 141, has been obtained. Because of this common etching step, alignment between the nanowire 120 and the nanowire 141 is guaranteed. The etching may advantageously be carried out so as to obtain a semiconductor nanowire 120 having a width comprised between 8 and 30 nm.

In FIG. 7, a step of partial etching of the nanowire 141 selectively with respect to the nanowire 120 has been carried out to obtain a hard mask 140 that is narrower than the stack of the nanowire 120 and of a gate-insulator layer 150. The selective partial etching is for example isotropic etching with $H_3PO_4$. The selective partial etching may for example form an offset on either side of the hard mask 140 of at least 2 nm with respect to the nanowire 120. Such selective etching allows the hard mask 140 to be made not as wide as the nanowire 120, and a hard mask 140 narrower than the width of the photolithography pattern to be obtained.

In FIG. 7, lateral faces 152 of the gate-insulator layer 150 have also been formed. The lateral faces 152 are typically formed by thermal oxidation of the lateral faces of the silicon nanowire 120. The gate-insulator layer 150 formed thus has lateral faces 152 on either side of the nanowire 120 and a top face 151 on the nanowire 120. The thickness of the lateral faces 152 is for example at least 4 nm, and preferably at least 5 nm.

Figure 8:
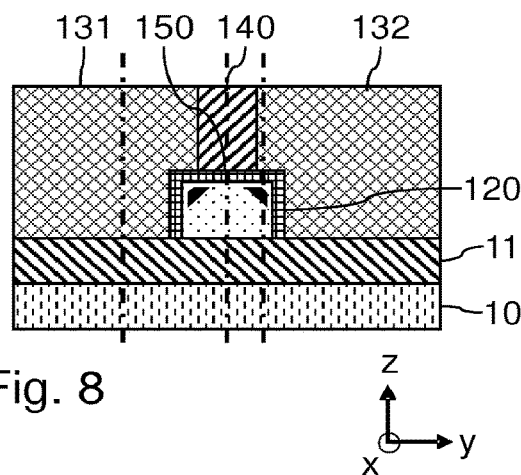

In FIG. 8, a gate material has been deposited on all the wafer. The gate material is for example doped polysilicon or a metal such as TiN. TiN may also be deposited and be coated with doped polysilicon. The deposition is carried out so as to have everywhere a height equal to that of the stack of the hard mask 140 and of the nanowire 120. The deposition of the gate metal is for example carried out to a thickness of 190 nm.

A planarization (for example by chemical-mechanical polishing) that is stopped after the hard mask 140 is reached has then been carried out. The planarization may for example be continued until a height of at least 40 nm of the hard mask 140 remains. Thus, gates 131 and 132 are obtained on either side of the stack of the nanowire 120 and of the hard mask 140. The planarization stopped on the hard mask 140 allows the joint between the gate material plumb with the hard mask 140 to be removed, and thus a short-circuit between the gates 131 and 132 to be avoided. The gates 131 and 132 are electrically insulated from each other by way of the dielectric hard mask 140 and by way of the gate-insulator layer 150. The gates 131 and 132 are electrically insulated from the nanowire 120 by way of the gate-insulator layer 150.

Figure 9:
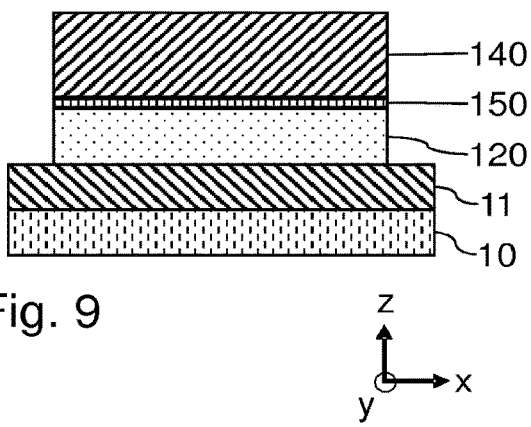
FIGS. 9 to 11 are longitudinal cross-sectional views of the component at the stage of fabrication illustrated in FIG. 8 in various planes.
Figure 10:
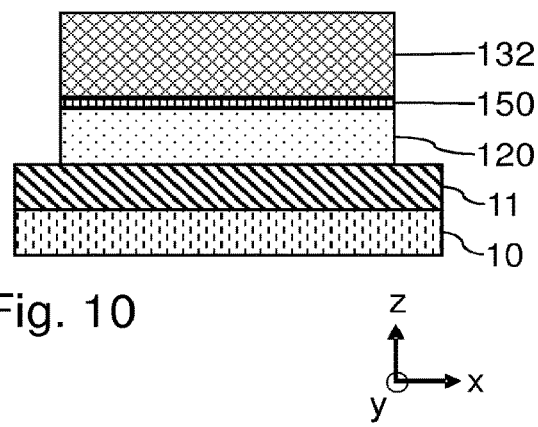
Figure 11:
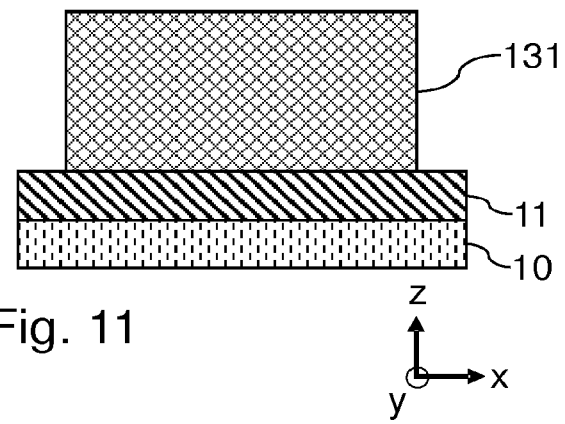

The dash-dotted lines in FIG. 8 correspond to various sectional planes:

FIG. 9 is a longitudinal cross-sectional view of a plane passing through the nanowire 120 and the hard mask 140, at this stage of the fabrication process;

FIG. 10 is a longitudinal cross-sectional view of a plane passing through the nanowire 120 and the gate 132, at this stage of the fabrication process; and FIG. 11 is a longitudinal cross-sectional view of a plane passing through the gate 131, at this stage of the fabrication process.

Figure 12:
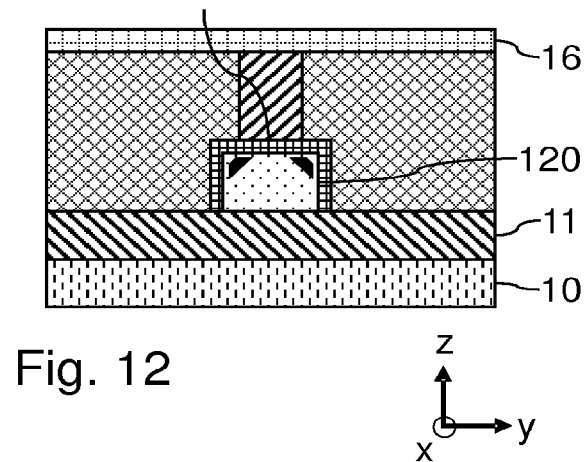
FIG. 12 is a transverse cross-sectional view of the component of FIG. 1 according to one variant of the fabrication process of the first embodiment.

In FIG. 12, a layer 16 has been deposited to form a hard mask, for example one made of oxide. In the variant illustrated in FIG. 13, the layer 16 includes a superposition of an SiN layer 161 and of an $SiO_2$ layer 162. The SiN layer 161 for example has a thickness of 40 nm. The $SiO_2$ layer 162 for example has a thickness of 27 nm. A photolithography mask patterned with the pattern of the gates and of the separating insulator between the gates is then formed on the layer 16.

Figure 13:
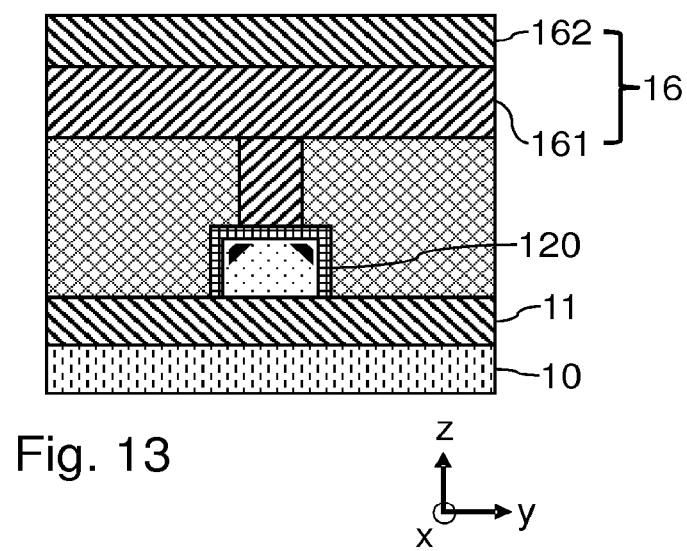
FIG. 13 is a transverse cross-sectional view of the component of FIG. 1 according to another variant of the fabrication process of the first embodiment.
Figure 14:
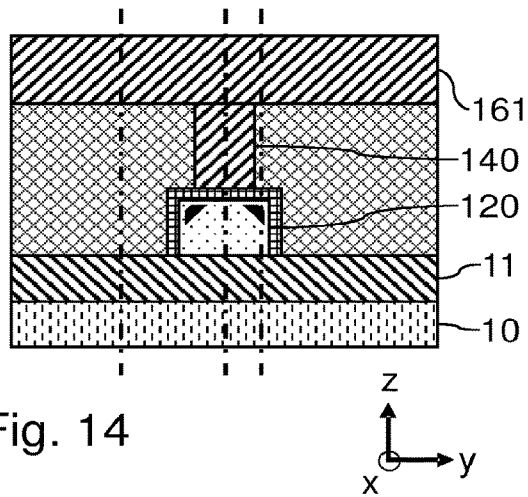
FIGS. 14 to 17 are cross-sectional views of the component in a subsequent step of a variant of the first embodiment.

In FIG. 14, the process of the variant illustrated in FIG. 13 has been continued. Here, the gates 131 and 132 and the separating insulator have been etched with the photolithography pattern, down to the layer 11 or down to the gate insulator 150 as appropriate. The etching also removes the SiN layer 161 and one portion of the hard mask 140, on either side of the middle portion of the nanowire (beyond the pattern defined by photolithography). The gate insulator 150 covering the nanowire 120 on its longitudinal ends is thus removed. The $SiO_2$ layer 162 has here been removed.

Figure 15:
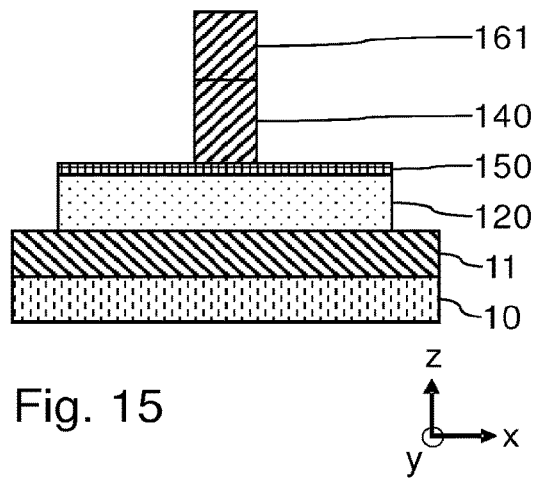
Figure 16:
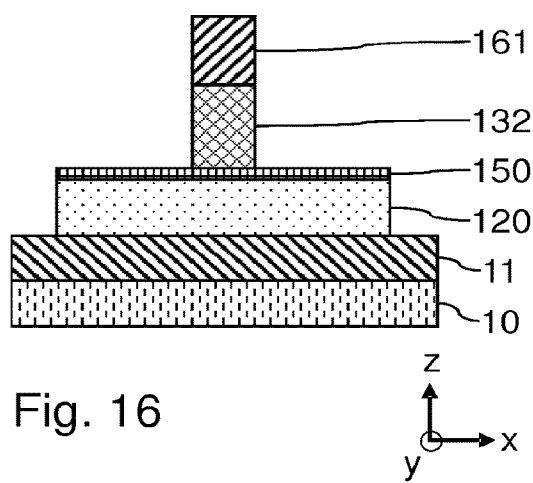
Figure 17:
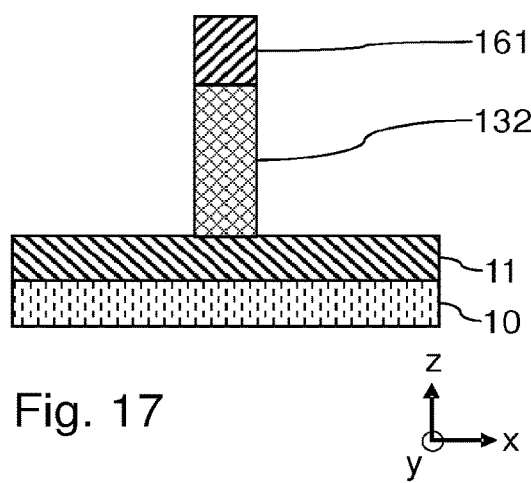
Figure 18:
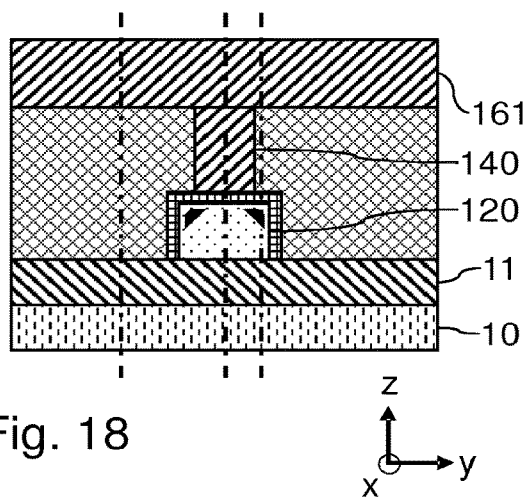
FIGS. 18 to 21 are cross-sectional views of the component in a subsequent step of a variant of the first embodiment.
Figure 19:
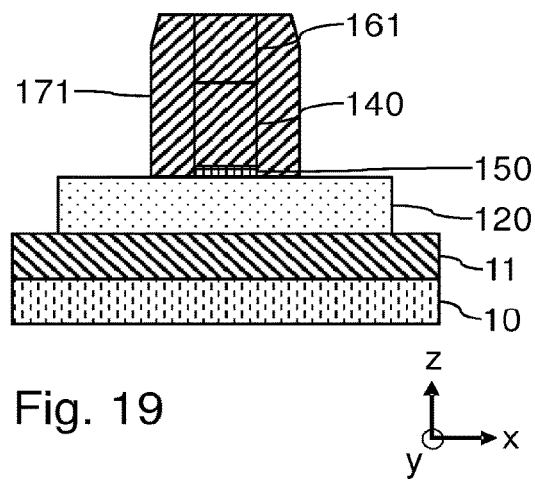
Figure 20:
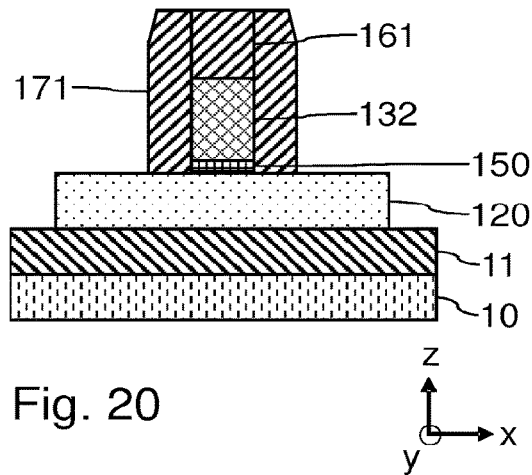
Figure 21:
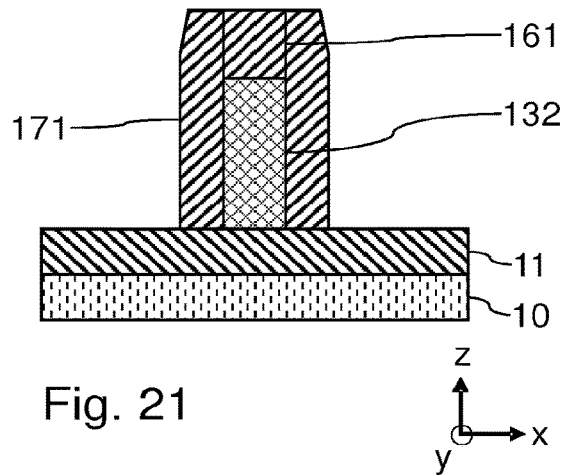

The dash-dotted lines in FIG. 14 correspond to various sectional planes:

FIG. 15 is a longitudinal cross-sectional view of a plane passing through the nanowire 120 and the hard mask 140, at this stage of the fabrication process. A stack of a residue of the layer 161 and of the hard mask 140 has been preserved plumb with the middle portion of the nanowire 120. The gate insulator 150 covering the nanowire 120 has been uncovered at the longitudinal ends of the nanowire 120. This stack forms an insulating partition between the gates 131 and 132;

FIG. 16 is a longitudinal cross-sectional view of a plane passing through the nanowire 120 and the gate 132, at this stage of the fabrication process. A stack of a residue of the layer 161, of the gate 132 and of the nanowire 120 has been preserved plumb with an edge of the middle portion of the nanowire 120; and FIG. 17 is a longitudinal cross-sectional view of a plane passing through the gate 131, at this stage of the fabrication process. A stack of a residue of the layer 161 and of the gate 132 has been preserved on one side of the middle portion of the nanowire 120.

In FIGS. 18 to 21, spacers 171 have been formed on either side longitudinally with respect to the gates 131 and 132 and with respect to the insulating partition between the gates 131 and 132. The spacers 171 are for example formed from SiN. The spacers 171 for example have a dimension comprised between 10 and 40 nm in the direction X.

Figure 22:
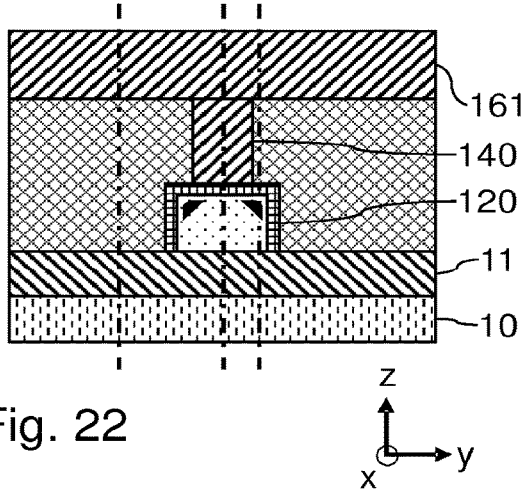
FIGS. 22 to 24 are cross-sectional views of the component in a subsequent step of a variant of the first embodiment.
Figure 23:
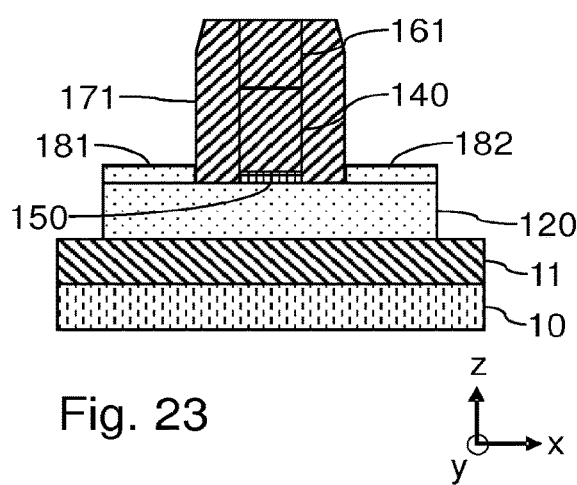
Figure 24:
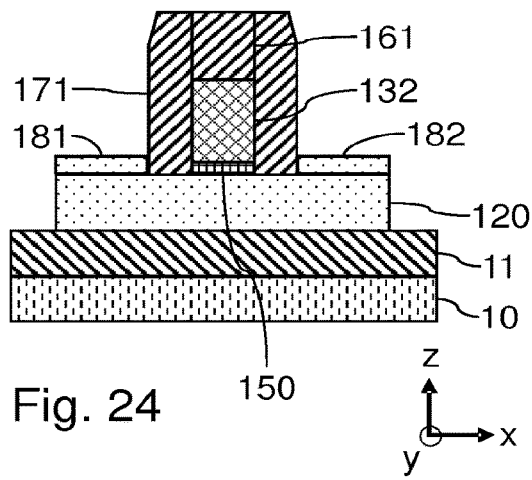
Figure 25:
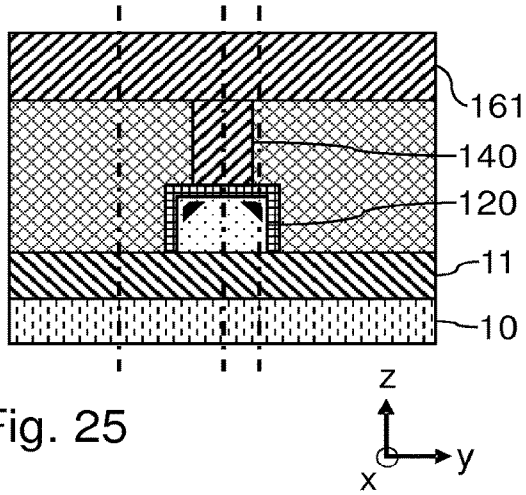
FIGS. 25 to 28 are cross-sectional views of the component in a subsequent step of a variant of the first embodiment.
Figure 26:
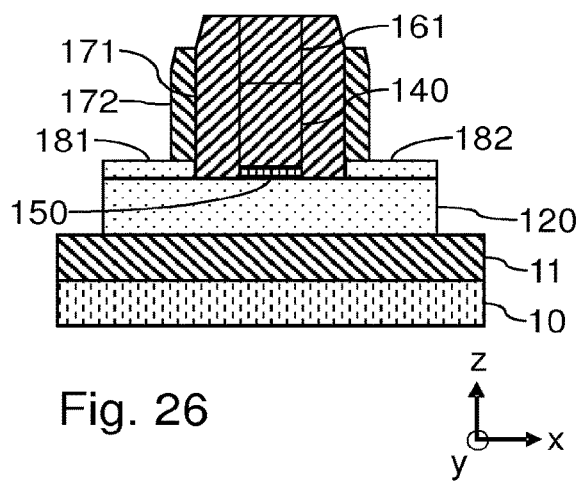
Figure 27:
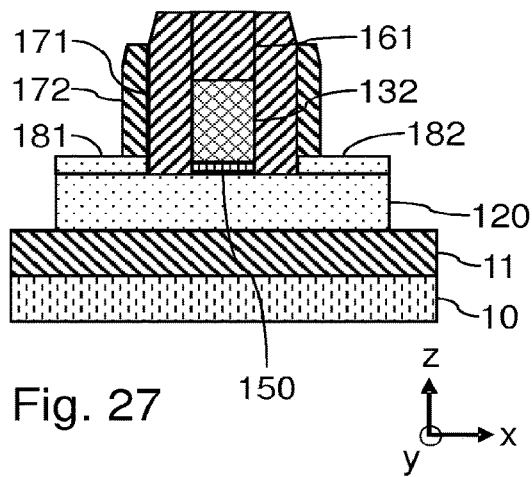
Figure 28:
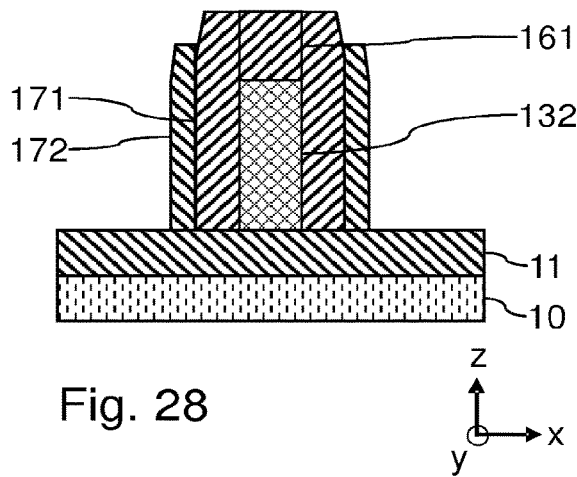
Figure 29:
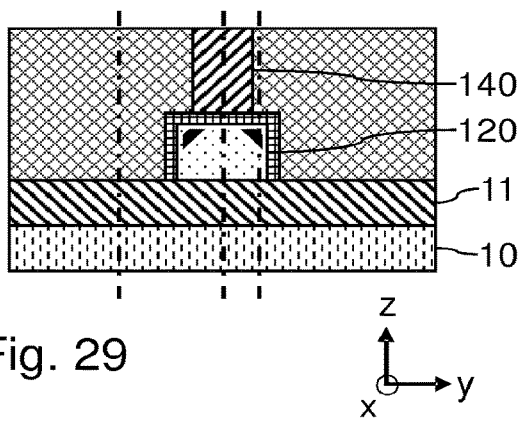
FIGS. 29 to 32 are cross-sectional views of the component in a subsequent step of a variant of the first embodiment.
Figure 30:
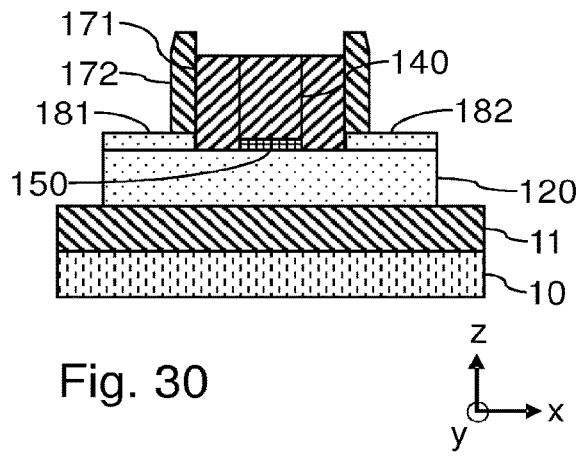
Figure 31:
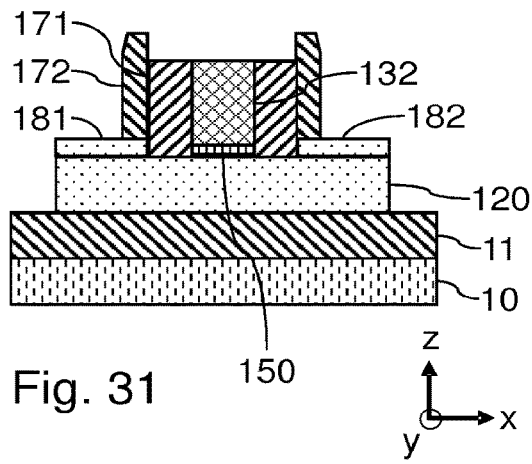
Figure 32:
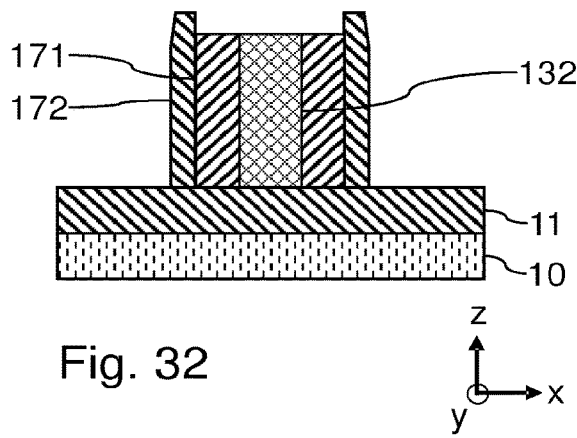
Figure 33:
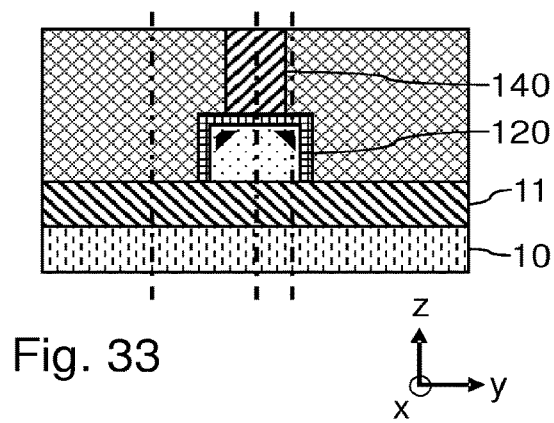
FIGS. 33 to 36 are cross-sectional views of the component in a subsequent step of a variant of the first embodiment.
Figure 34:
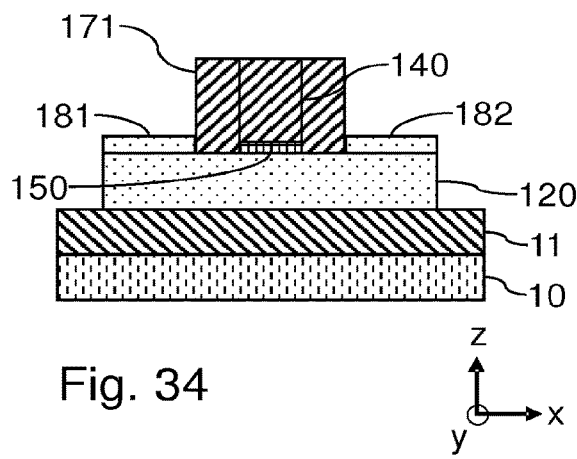
Figure 35:
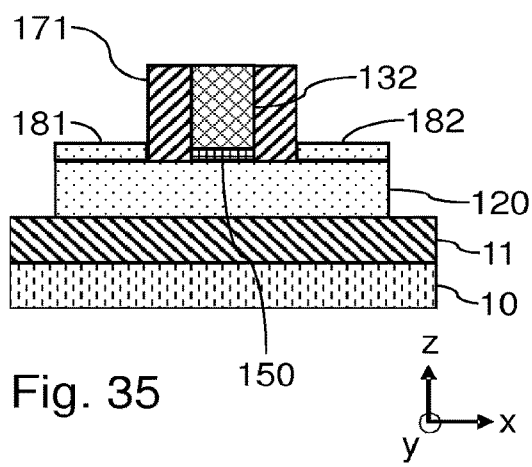
Figure 36:
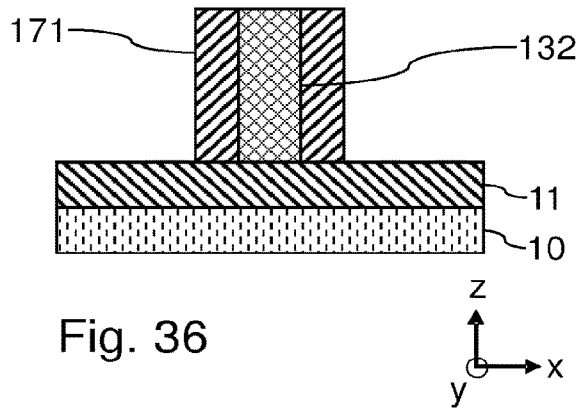

In FIGS. 22 to 24, raised conduction electrodes 181 and 182 have been formed on the nanowire 120, on either side of its middle portion and of the insulating partition. The raised conduction electrodes may for example be formed by means of epitaxial growth on the nanowire 120.

In FIGS. 25 to 28, spacers 172 have been formed, against respective spacers 171. The spacers 172 are therefore positioned on either side longitudinally with respect to the gates 131 and 132 and with respect to the insulating partition between the gates 131 and 132. The spacers 172 are for example formed from $SiO_2$. The spacers 172 are intended to protect the lateral faces of the spacers 171 during a subsequent step of removing the layer 161, when the latter is made of the same material as the spacers 171.

In FIGS. 29 to 32, the layer 161 and the top portion of the spacers 171 have been removed by etching. Thus an access to the top surface of the gates 131 and 132 has been produced.

In FIGS. 33 to 36, the spacers 172 have been removed by selective etching, in a way known per se. Ion implantation of dopants into the conduction electrodes 181 and 182 has also advantageously been carried out. A step of siliciding the top faces of the conduction electrodes and of the gates may also advantageously then be carried out.

In a way known per se, it is then possible to deposit a passivation layer, then to make contacts to the gates 131 and 132 and the conduction electrodes 181 and 182.

The process for fabricating such an electronic circuit 1 may employ technological steps and materials that are commonplace in fabricating processes in CMOS technology. Therefore, a fabrication process according to the invention may be carried out with a high level of control and at a relatively low cost.

According to one variant, the fabrication process may include an electrical connection of the semiconductor layer 10 to a biasing circuit (not illustrated). If the semiconductor layer 10 is biased and if the layer 11 is sufficiently thin, it is then possible to electrostatically control the nanowire 12 with this bias.

With respect to the steps described with reference to FIGS. 5 and 6, a fabrication process according to the second embodiment may be identical to that of the first embodiment. A step of forming lateral faces of the gate-insulator layer 150, for example by thermal oxidation of the lateral faces of the nanowire 120, is then carried out. At this stage, the lateral faces of the hard mask 140 are aligned (in the direction Y) with the lateral faces of the gate-insulator layer 150. Gate material is then deposited on the whole wafer as described with reference to FIG. 8. The deposited gate material does not extend over the gate insulator 150 and nanowire 120, because of the alignment between the lateral faces of the hard mask 140 and the lateral faces of the gate-insulator layer.

A planarization (for example by chemical-mechanical polishing) that is stopped after the hard mask 140 is reached is then carried out as described for the first embodiment.

The fabrication process according to the second embodiment may then be continued as described with reference to FIGS. 13 to 36 for the first embodiment.

With respect to the steps described with reference to FIGS. 5 and 6, a fabrication process according to the third embodiment may be identical to that of the first embodiment. Next, a step of forming lateral faces of the gate-insulator layer 150 is carried out, for example by thermal oxidation of the lateral faces of the nanowire 120. At this stage, the lateral faces of the hard mask 140 are aligned (in the direction Y) with the lateral faces of the gate-insulator layer 150.

Next, an implantation of $H_2$ into only one of the lateral faces of the hard mask 140 is carried out. Next, selective etching, for example with HF, is carried out. Next, gate material is deposited on all the wafer as described with reference to FIG. 8. On one side of the hard mask 140, the deposited gate material does not extend over the gate insulator 150 and the nanowire 120, because of the alignment between the lateral faces of the hard mask 140 and the lateral faces of the gate-insulator layer. On the other side of the hard mask 140, the gate material extends over the gate insulator 150 and the nanowire 120.

A planarization (for example by chemical-mechanical polishing) that is stopped after the hard mask 140 is reached is then carried out, as described for the first embodiment.

The fabrication process according to the third embodiment may then be continued as described with reference to FIGS. 13 to 36 for the first embodiment.

Figure 37:
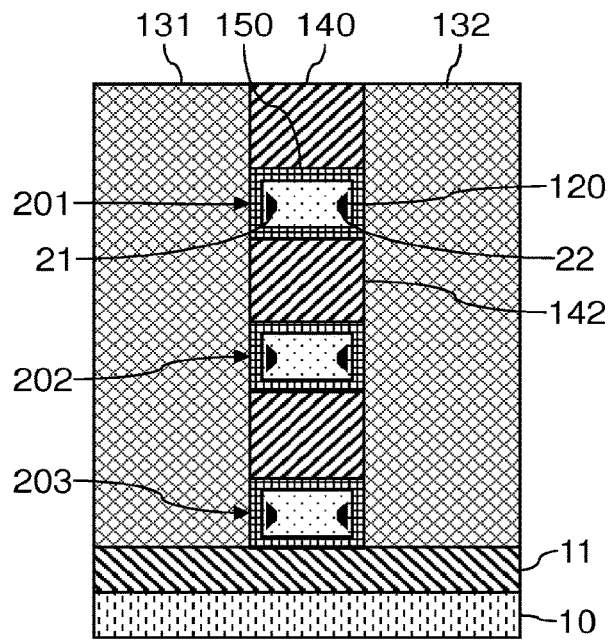
FIG. 37 is a transverse cross-sectional view of a vertical stack of electronic components, obtained according to one variant of the fabrication process of the second embodiment.

FIG. 37 is a transverse cross-sectional view of a vertical stack of electronic components 201, 202 and 203 able to be obtained using a variant of the second embodiment. The substrate is here identical to that of FIG. 3. Each of the electronic components 201, 202 and 203 comprises:

a semiconductor nanowire 120;

a gate-insulator layer 150 covering the middle portion of the nanowire;

quantum dots 21 and 22 formed in proximity to opposite lateral faces of the nanowire 120, in its middle portion.

A dielectric hard mask 140 has been formed on the gate insulator 150 of the component 201. A dielectric nanowire 142 has been interposed between the gate insulator of the component 201 and the gate insulator of the component 202. Another dielectric nanowire has been interposed between the gate insulator of the component 202 and the gate insulator of the component 203. The dielectric nanowires have the same width as the nanowires 120 covered with gate insulator. The lateral faces of the dielectric nanowires (and of the hard mask 140) are therefore aligned with the lateral faces of the gate-insulator layers.

In the middle portion of the nanowires 120, control gates 131 and 132 have been produced on either side of the stack of electronic components 201 to 203, over the entire height of this stack. The gates 131 and 132 here do not extend over the gate insulators and nanowires 120.

Such a configuration allows the density of quantum dots for a given substrate area to be increased.

Figure 38:
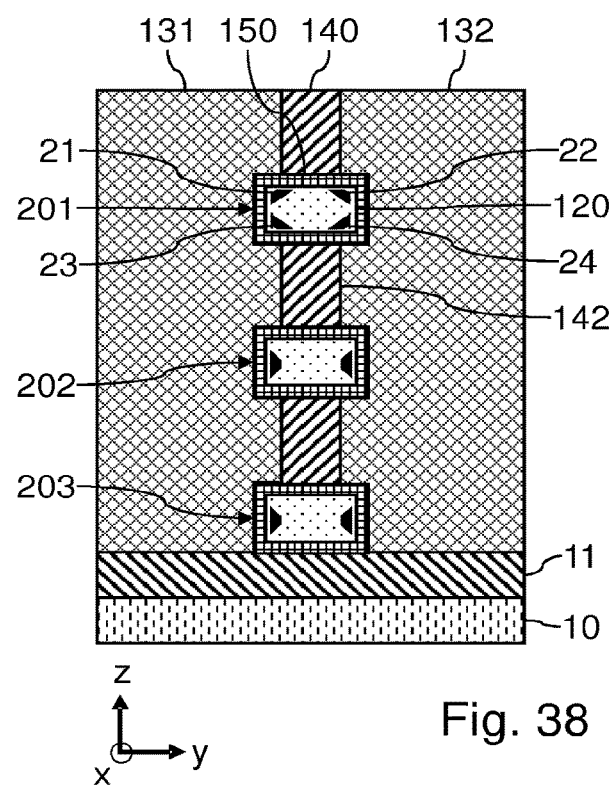
FIG. 38 is a transverse cross-sectional view of a vertical stack of electronic components, obtained according to one variant of the fabrication process of the first embodiment.

FIG. 38 is a transverse cross-sectional view of a vertical stack of electronic components 201, 202 and 203 able to be obtained using a variant of the first embodiment. The substrate is here identical to that of FIG. 2. Each of the electronic components 201, 202 and 203 comprises:

a semiconductor nanowire 120;

a gate-insulator layer 150 covering the middle portion of the nanowire 120; and quantum dots 21 and 24 formed in proximity to ridges of the nanowire 120, in its middle portion.

A dielectric hard mask 140 has been formed on the gate insulator 150 of the component 201 and is not as wide as this gate insulator 150. A dielectric nanowire 142 has been interposed between the gate insulator of the component 201 and the gate insulator of the component 202 and is not as wide as their gate insulators. Another dielectric nanowire has been interposed between the gate insulator of the component 202 and the gate insulator of the component 203 and is not as wide as their gate insulators. The lateral faces of the dielectric nanowires are therefore offset (in the direction Y) with respect to the lateral faces of the gate-insulator layers.

In the middle portion of the nanowires 120, control gates 131 and 132 have been produced on either side of the stack of electronic components 201 to 203, over the entire height of this stack. The gates 131 and 132 here extend over the gate insulators and nanowires 120. With such a configuration of the control gates 131 and 132, it is possible to control four quantum dots for each of the electronic components 201 to 203.

Such a configuration allows the density of quantum dots for a given substrate area to be increased.

In the examples described and illustrated, a silicon-on-insulator substrate has been used. The invention is of course also applicable to bulk substrates.

In the various examples of fabrication processes, the gate-insulator layer 150 is advantageously formed with a single dielectric layer, advantageously a single layer made of a homogenous dielectric. It is also possible to envision the gate-insulator layer 150 being formed in two steps, with a superposition of a dielectric layer and of an interface layer. Advantageously, the formed gate-insulator layer 150 includes no nitride, nor a superposition of a nitride layer and another dielectric layer.

The invention claimed is:

1. A process for fabricating an electronic component incorporating double quantum dots and split gates, the electronic component comprising a substrate surmounted with a stack including a semiconductor layer and a dielectric layer that is formed above the semiconductor layer, the process comprising:

forming a mask on the dielectric layer;

etching the dielectric layer and the semiconductor layer with the pattern of the mask, so as to form a stack including a semiconductor nanowire and a dielectric hard mask, the semiconductor nanowire being configured to contain the double quantum dots;

depositing a gate material on the stack including the semiconductor nanowire and the dielectric hard mask and on the substrate;

carrying out a planarization, until the dielectric hard mask is reached, so as to form first and second gates that are electrically insulated from each other on either side of said semiconductor nanowire, the first and second gates comprising the split gates.

2. The process as claimed in claim 1, wherein said etching is carried out so that the dielectric hard mask has, on either side, an offset of at least 2 nm with respect to the semiconductor nanowire.

3. The process as claimed in claim 1, wherein said etching is carried out so as to decrease a width of the dielectric hard mask.

4. The process as claimed in claim 1, comprising forming the dielectric hard mask to be asymmetric with respect to a vertical plane passing through a center of the semiconductor nanowire.

5. The process as claimed in claim 1, wherein said semiconductor layer is formed from silicon alloy, the process further comprising forming a thermal-oxide layer by thermal oxidation of a top portion of the semiconductor layer before forming the dielectric layer.

6. The process as claimed in claim 1, wherein said semiconductor nanowire is formed from silicon alloy, and wherein the process further comprises forming lateral faces of a gate insulator by thermal oxidation of edges of the semiconductor nanowire before the deposition of the gate material.

7. The process as claimed in claim 1, wherein said substrate comprises a silicon-on-insulator substrate.

8. The process as claimed in claim 7, further comprising electrically connecting a biasing circuit to said substrate.

9. The process as claimed in claim 1, wherein said deposited gate material comprises doped polysilicon.

10. The process as claimed in claim 1, wherein said semiconductor nanowire has a width comprised between 8 and 30 nm.

* * * * *